United States Patent [19]
Golin

[11] Patent Number: 5,574,449
[45] Date of Patent: Nov. 12, 1996

[54] SIGNAL PROCESSING WITH HYBRID VARIABLE-LENGTH AND ENTROPY ENCODIDNG

[75] Inventor: Stuart J. Golin, East Windsor, N.J.

[73] Assignee: Intel Corporation, Santa Clara, Calif.

[21] Appl. No.: 393,718

[22] Filed: Feb. 24, 1995

[51] Int. Cl.$^6$ .................................................. H03K 13/24
[52] U.S. Cl. ............................... 341/65; 341/67; 341/106
[58] Field of Search .................................. 341/67, 65, 107

[56] References Cited

U.S. PATENT DOCUMENTS 4,122,440  10/1978  Langdow, Jr. et al. ................. 340/347

Primary Examiner—Jeffrey A. Gaffin
Assistant Examiner—Peguy JeanPierre
Attorney, Agent, or Firm—William H. Murray; N. Stephan Kinsella

[57] ABSTRACT

A computer-implemented method for processing signals. According to a preferred embodiment, at least one dominant symbol of a set S comprising a plurality of symbols is determined and a dominant set comprising the at least one dominant symbol is formed. A next symbol for encoding is received. It is determined whether the next symbol is in the dominant set. The next symbol is encoded by either entropy encoding or variable-length encoding in accordance with this determination.

20 Claims, 4 Drawing Sheets

SIGNAL PROCESSING WITH HYBRID VARIABLE-LENGTH AND ENTROPY ENCODIDNG

BACKGROUND OF THE INVENTION

1. Field of the Invention

The present invention relates to signal processing and, in particular, to computer-implemented processes and apparatuses for signal processing with hybrid variable-length and entropy encoding.

2. Description of the Related Art

This invention relates to signal processing which is often utilized to compress signals into an encoded bitstream. The signals may represent, for example, video frames, or other types of data such as ASCII text strings. The portion of an encoded bitstream representing compressed data may be stored in a mass storage device in its compressed format in order to conserve storage space. When the compressed data is later retrieved it may be decompressed and, for example, displayed on a monitor or printed on a printer device.

When the data to be compressed or encoded comprise a set of symbols, the symbols are often not completely randomly distributed. Rather, there is often a statistical probability distribution amount the symbols constituting the symbol set. If the symbol set from which up to n possible symbols are drawn is denoted by S, then $S=\{S_0, S_1, \ldots, S_{n-1}\}$, where $S_i$ represents the symbol having the probability $p_i$. In this usage, it is assumed that these probabilities are ordered in monotonically decreasing fashion so that, for example, $S_0$ is the most probable symbol of S and $S_{n-1}$ is the least probable symbol of S. It is also assumed in such usages that the occurrences of these symbols are uncorrelated, i.e. they come from a memoryless source.

There are currently two major methods of encoding these symbols: entropy encoding and variable-length coding (VLC). Entropy encoding methods are methods that approach the theoretical entropy limit in efficiency, such as arithmetic encoding. Arithmetic encoding approaches optimal encoding efficiency, but is complex to implement. VLC encoders such as Huffman encoders are simpler to implement but less efficient in some cases. Therefore, VLC is often used and usually works very well. In VLC techniques, at least one bit is needed in the bitstream to represent each symbol, whereas only fractions of bits may be required in some instances to represent some symbols in entropy encoding techniques. Such encoding techniques are described in the paper Ian H. Witten, Radford M. Neal, and John G. Cleary, "Arithmetic Coding for Data Compression," *Communications of the ACM,* Vol. 30, No. 6, pp. 520–540 (June 1987), the entirety of which is incorporated herein by reference. Further such techniques are described in William B. Pennebaker & Joan L. Mitchell, *JPEG: Still Image Data Compression Standard* (New York: Van Nostrand Reinhold, 1993), chapters 8 and 11–12 of which are incorporated herein by reference.

As explained above, in typical cases VLC encoding works very well, and produces an encoded bitstream that is nearly as small, within a few percent, as the encoded bitstream that would be produced by utilizing the more complex technique of entropy encoding. However, when one of the symbols of a symbol set (i.e. $S_0$) is dominant, e.g. the probability of $S_0$ is much larger than 0.5, then VLC is significantly less efficient than entropy encoding. That is, in this case, the average number of bits per symbol required in the encoded bitstream is significantly higher for VLC than for entropy encoding. The reason for this result lies in the fact that in VLC, at least one bit is needed to represent even the most dominant symbol $S_0$, whereas only a fraction of a bit is needed to represent the dominant symbol in entropy encoding when its probability $p_0$ is >0.5.

For example, assume that a symbol set S is approximately distributed in accordance with a geometric series of probability, of the form $p_i=(1-r)*r^i$, where r=0.1, so that $p_0=0.9$, $p_1=0.09$, $p_2=0.009$, $p_3=0.0009$, ... where $p_i$ is the probability of symbol $S_i$ of S. In this case, the average number of bits per symbol for a Huffman type of VLC scheme is 1.111, whereas that for entropy encoding is only 0.521. (However, where no symbol is dominant, Huffman and entropy encoding produce more similar results. For example, assume that S is approximately distributed in accordance with another geometric series of probability, so that $p_0=0.1$, $p_1=0.09$, $p_2=0.081$, $p_3=0.0729$, .... In this case the average number of bits per symbol for Huffman encoding is 4.725, and that for entropy encoding is 4.690.)

There is thus a need for methods and apparatuses for processing signals that retain the simplicity of VLC techniques while minimizing the VLC encoding inefficiency.

SUMMARY

There is provided herein a computer-implemented method for processing signals. According to a preferred embodiment of the invention, at least one dominant symbol of a set S comprising a plurality of symbols is determined and a dominant set comprising the at least one dominant symbol is formed. A next symbol for encoding is received. It is determined whether the next symbol is in the dominant set. The next symbol is encoded by either entropy encoding or variable-length encoding in accordance with this determination.

BRIEF DESCRIPTION OF THE DRAWINGS

These and other features, aspects, and advantages of the present invention will become more fully apparent from the following description, appended claims, and accompanying drawings in which:

DESCRIPTION OF THE PREFERRED EMBODIMENT

In the present invention, there is disclosed a method and apparatus for processing symbols utilizing hybrid VLC and entropy encoding techniques. In a preferred embodiment, as described in further detail hereinbelow, only certain dominant symbol(s) are encoded according to entropy techniques, while the remaining symbols are encoded with VLC. The decoder then decodes the encoded bitstream by first utilizing entropy decoding to determine whether or not a current symbol is entropy encoded (and thus a dominant symbol). If not, the decoder switches to VLC decoding to determine the VLC-encoded symbol. The present invention thus implements the relative simplicity of a VLC scheme, while approaching the efficiency of entropy encoding techniques when at least one symbol dominates the symbol set in terms of probability.

Video Processing System Hardware

Figure 1:
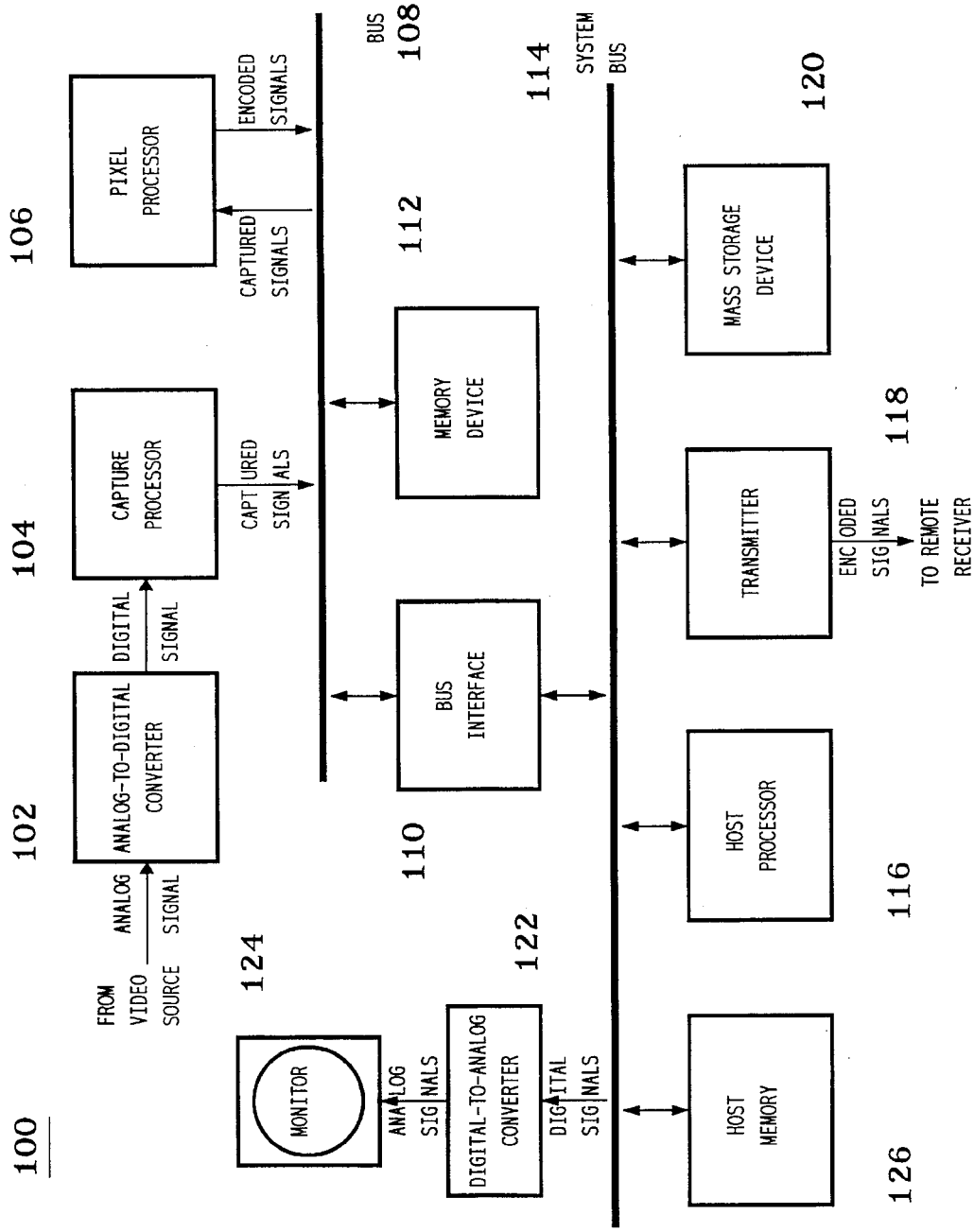
FIG. 1 is a computer-based video signal processing system for encoding video signals, according to a preferred embodiment of the present invention.

Referring now to FIG. 1, there is shown a computer-based signal encoding system 100 for encoding signals representative of data, according to a preferred embodiment of the present invention. Encoding system 100 may be utilized to encode data signals comprising various types of symbol sets, such as video data. Encoding system 100 is described with reference to the encoding of data representative of video images, e.g. representative of the coefficients of a discrete cosine transform (DCT), or of motion vectors calculated using in motion estimation techniques. In general, such symbols represent data that may already be transformed by other techniques, and that are to be encoded via arithmetic or Huffman encoding before transmission or storage. Such symbols constitute a symbol set S and are typically associated with a probability distribution. Those skilled in the art will appreciate that encoding systems may also be utilized to encode symbols representative of non-video forms of data as well, such as audio or textual data.

Analog-to-digital (A/D) converter 102 of encoding system 100 receives analog video image signals from a video source. The video source may be any suitable source of analog video image signals such as a video camera or VCR for generating local analog video image signals or a video cable or antenna for receiving analog video image signals from a remote source. A/D converter 102 decodes (i.e., separates the signal into constituent components) and digitizes each frame of the analog video image signals into digital image component signals (e.g., in a preferred embodiment, Y, U, and V component signals).

Capture processor 104 receives, captures, and stores the digitized component signals as subsampled video images in memory device 112 via bus 108. Each subsampled video image is represented by a set of two-dimensional component planes or pixel bitmaps, one for each component of the digitized video image signals. In a preferred embodiment, capture processor 104 captures video image signals in a YUV9 or YUV4:1:1 format, in which every (4×4) block of pixels of the Y component plane corresponds to a single pixel in the U component plane and a single pixel in the V component plane.

Pixel processor 106 accesses captured bitmaps from memory device 112 via bus 108 and generates encoded image signals that represent one or more of the captured video images. Depending upon the particular encoding method implemented, as described in more detail below, pixel processor 106 applies a sequence of compression techniques to reduce the amount of data used to represent the information in each image. The encoded bitstream representative of the image may then be stored to memory device 112 via bus 108 for transmission to host processor 116 via bus 108, bus interface 110, and system bus 114 for storage in host memory 126.

Host processor 116 may transmit the encoded image to transmitter 118 for real-time transmission to a remote receiver (not shown in FIG. 1), store the encoded image to mass storage device 120 for future processing, or both. In addition, digital-to-analog converter 122 may receive and convert digital image signals to analog image signals for display in one or more windows on monitor 124. These image signals may correspond, for example, to raw captured video images or companded video images (i.e., the results of compressing and decompressing selected captured video images).

Figure 2:
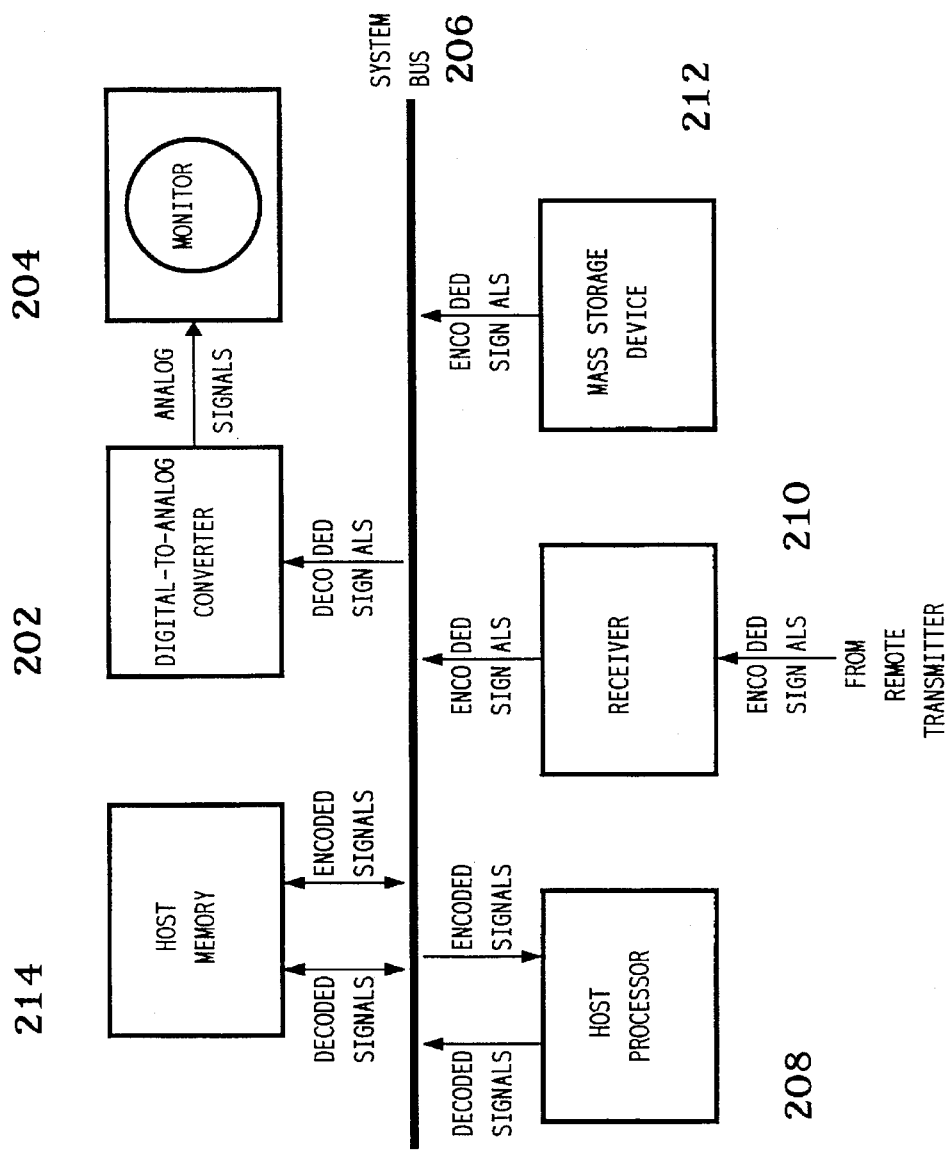
FIG. 2 is a computer-based decoding system for decoding the video signals encoded by the video processing system of FIG. 1, according to a preferred embodiment of the present invention.

Referring now to FIG. 2, there is shown a computer-based decoding system 200 for decoding the image signals encoded by encoding system 100 of FIG. 1, according to a preferred embodiment of the present invention. Host processor 208 of decoding system 200 receives encoded image signals via system bus 206 that were either stored in mass storage device 212 or received by receiver 210 from a remote transmitter, such as transmitter 118 of FIG. 1. The host processor 208 temporarily stores the encoded image signals in host memory 214.

Host processor 208 decodes the encoded image signals and scales the decoded image signals for display. Decoding the encoded image signals involves undoing the compression processing implemented by pixel processor 106 of encoding system 100 of FIG. 1. Scaling the decoded image signals involves upsampling the U and V component signals to generate full-sampled Y, U, and V component signals in which there is a one-to-one-to-one correspondence between Y, U, and V pixels in the scaled component planes. Scaling may also involve scaling the component signals to a display size and/or resolution different from the image signals as original captured. Host processor 208 then stores the scaled decoded image signals to host memory 214 for eventual transmission to digital-to-analog (D/A) converter 202 via system bus 206. D/A converter converts the digital scaled decoded image signals to analog image signals for display on monitor 204.

Referring again to FIG. 1, encoding system 100 is preferably a general microprocessor-based personal computer (PC) system with a special purpose video-processing plug-in board. In particular, A/D converter 102 may be any suitable means for decoding and digitizing analog video image signals. Capture processor 104 may be any suitable processor for capturing digitized video image component signals as subsampled frames. Pixel processor 106 may be any suitable means for encoding subsampled video image signals, where the means is capable of implementing a forward discrete cosine transform. Memory device 112 may be any suitable computer memory device and is preferably a video random access memory (VRAM) device. Bus 108 may be any suitable digital signal transfer device and is preferably an Industry Standard Architecture (ISA) bus or Extended ISA (EISA) bus. Bus interface 110 may be any suitable means for interfacing between bus 108 and system bus 114. In a preferred embodiment, A/D converter 102, capture processor 104, pixel processor 106, bus 108, bus interface 110, and memory device 112 are contained in a single plug-in board, such as an Intel® ActionMedia®-II board, capable of being added to a general microprocessor-based personal computer (PC) system.

Host processor 116 may be any suitable means for controlling the operations of the special-purpose video processing board and is preferably an Intel® general purpose microprocessor such as an Intel® 386, 486, or Pentium® processor. Host memory 126 may be any suitable memory device used in conjunction with host processor 116 and is preferably a combination of random access memory (RAM) and read-only memory (ROM). System bus 114 may be any suitable digital signal transfer device and is preferably an Industry Standard Architecture (ISA) bus or Extended ISA (EISA) bus. Mass storage device 120 may be any suitable means for storing digital signals and is preferably a computer hard drive. Transmitter 118 may be any suitable means for transmitting digital signals to a remote receiver and preferably transmits digital signals over PSTN lines. Those skilled in the art will understand that the encoded video signals may be transmitted using any suitable means of transmission such as telephone line (PSTN or ISDN), RF antenna, local area network, or remote area network.

D/A converter 122 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

Referring now to FIG. 2, decoding system 200 is preferably a general microprocessor-based personal computer (PC) system similar to the basic PC system of encoding system 100. In particular, host processor 208 may be any suitable means for decoding and scaling encoded image signals and is preferably an Intel® general purpose microprocessor such as an Intel® 386, 486, or Pentium® processor. Host memory 214 may be any suitable memory device used in conjunction with host processor 116 and is preferably a combination of random access memory (RAM) and read-only memory (ROM). In an alternative preferred embodiment, decoding system 200 may also have a pixel processor similar to pixel processor 106 of FIG. 1 for decoding the encoded image signals and a display processor such as an Intel® i750® Display Processor for scaling the decoded image signals.

System bus 206 may be any suitable digital signal transfer device and is preferably an Industry Standard Architecture (ISA) bus or Extended ISA (EISA) bus. Mass storage device 212 may be any suitable means for storing digital signals and is preferably a CD-ROM device. Receiver 210 may be any suitable means for receiving the digital signals transmitted by transmitter 118 of encoding system 100. D/A converter 202 may be any suitable device for converting digital image signals to analog image signals and is preferably implemented through a personal computer (PC)-based display system such as a VGA or SVGA system. Monitor 204 may be any means for displaying analog image signals and is preferably a VGA monitor.

In a preferred embodiment, encoding system 100 of FIG. 1 and decoding system 200 of FIG. 2 are two distinct computer systems. In an alternative preferred embodiment of the present invention, a single computer system comprising all of the different components of systems 100 and 200 may be used to encoded and decoded video image signals. Those skilled in the art will understand that such a combined system may be used to display decoded video image signals in real-time during the capture and encoding of video signals to monitor the encoding processing. In a preferred embodiment encoding system 100 encodes video image signals in real time to yield an encoded bitstream, and transmits the encoded bitstream to decoding system 200. Encoding system 100 is configured to implement the encoding method of the current invention, and decoding system 200 is configured to implement the decoding method of the present invention, as described in further detail hereinbelow.

Hybrid Encoding

In a preferred embodiment of the present invention, arithmetic encoding (and decoding) is utilized as a preferred implementation of entropy encoding (decoding), and Huffman encoding (decoding) is utilized as a preferred type of VLC encoding (decoding). Before encoding symbols of a symbol set S having a known or predicted probability distribution set P, when Huffman encoding is used in prior techniques, a Huffman tree is constructed in accordance with the distribution of symbol probabilities P.

In the present invention, encoding system 100 first determines whether there is at least one dominant symbol $S_0$, such that $p_0 >> 0.5$. If $p_0$ is much greater than 0.5, i.e. if $p_0 \geq p_T$, a threshold probability, then $S_0$ will be encoded and decoded utilizing arithmetic coding techniques. A new symbol set $S_H$ is formed that comprises a subset of S that will be encoded and decoded utilizing Huffman encoding techniques. In a preferred embodiment, $p_T=0.7$, and if $p_0 \geq 0.7$, then $S_0$ is considered to be a relatively dominant symbol of S. In this case, $S_H=\{S-S_0\}$, so that a Huffman tree is constructed utilizing all the members of S save the most dominant symbol $S_0$.

Thus, in the present invention, because only the most dominant symbols are encoded with arithmetic encoding, the relatively higher overhead and complexities involved in arithmetic encoding are minimized while, at the same time, the relative inefficiencies of encoding dominant symbols with Huffman encoding are minimized as well.

Figure 3:
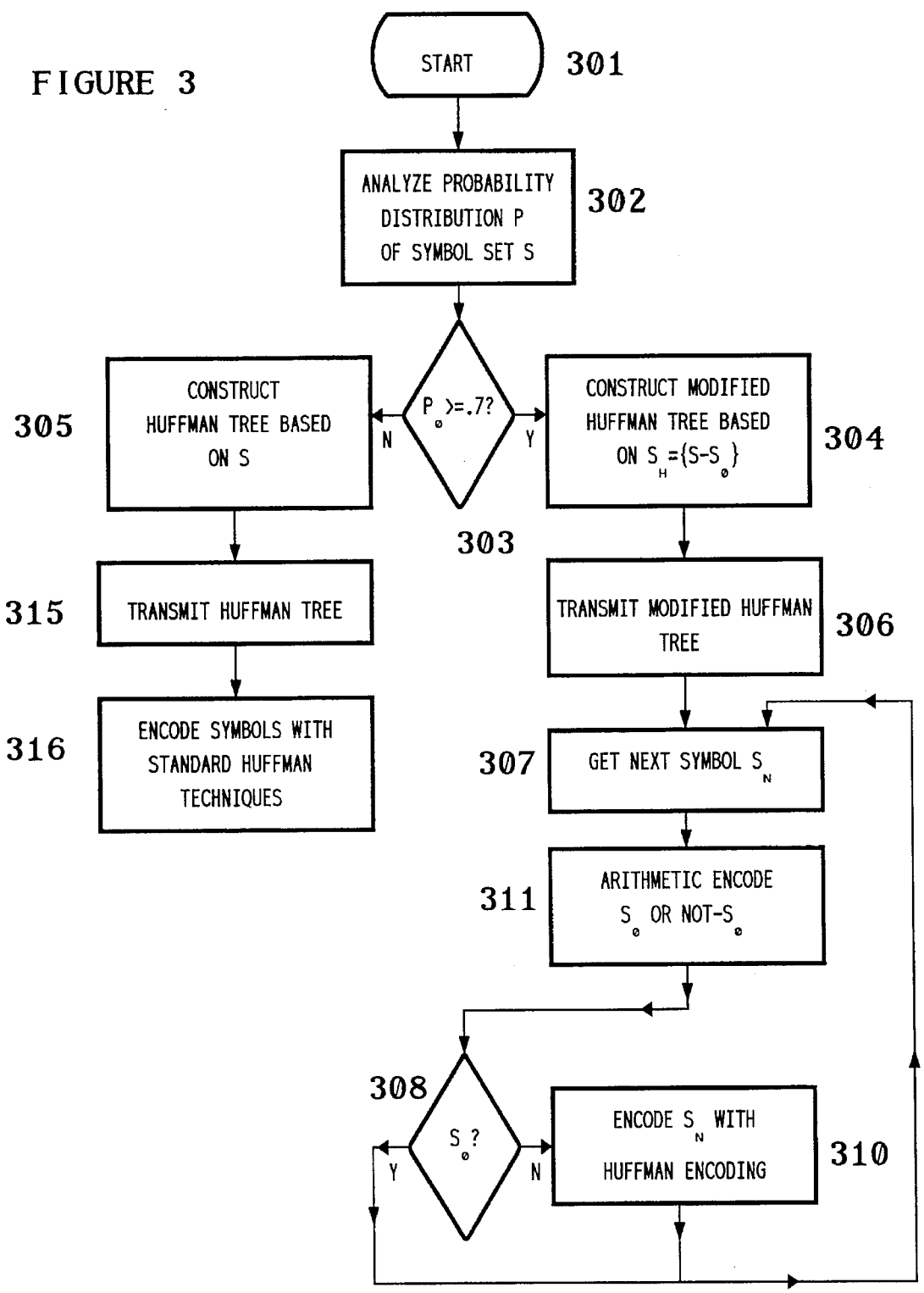
FIG. 3 is a flow chart of the method of encoding of the present invention.

Referring now to FIG. 3, there is shown a flow chart of the method of encoding of the present invention, which may be implemented on video system 100 of FIG. 1. As illustrated in FIG. 3, the probability distribution set P of symbol set S (step 302 of FIG. 3) is analyzed. If $p_0$ is greater than or equal to the threshold probability $p_T$, i.e., if $p_0 \geq 0.7$ (step 303), this indicates that $S_0$ is dominant and should be arithmetic encoded rather than Huffman encoded. Thus, if $p_0 \geq 0.7$ (step 303), a Huffman tree is constructed utilizing modified Huffman symbol set $S_H=\{S-S_0\}$ (step 304).

Alternatively, if $p_0<0.7$ (step 303), $S_0$ is not dominant and the standard Huffman technique is used. Therefore, in this case a Huffman tree is constructed based on S (step 305). The standard Huffman tree is thus transmitted in this case (step 315) and subsequent symbols are thus encoded and transmitted in accordance with standard Huffman encoding techniques (step 316).

If, however, the modified Huffman tree has been constructed (step 304), then the modified Huffman tree is transmitted to a decoding system (step 306), and all further symbols $S_i$ to be encoded are encoded utilizing the hybrid signal encoding method of the present invention. The remainder of this discussion of FIG. 3 therefore concentrates on this hybrid encoding method assuming $S_0$ is dominant. As will be understood by those skilled in the art, in alternative preferred embodiments of the present invention, steps 302, 305, and 306 may be performed off line by a separate processor, and the modified Huffman tree may be hard-wired or hard-programmed, e.g. in a ROM table, within decoding system 200.

After the modified Huffman tree is constructed and transmitted (steps 304 and 306), the next symbol $S_N$ to be encoded is received (step 307). If next symbol $S_N$ is the dominant symbol $S_0$ then it has already been arithmetically encoded (step 311).

Otherwise, $S_N \diamond S_0$, and the "Not-$S_0$" symbol is arithmetic encoded, telling decoding system 200 to decode the next symbol with Huffman decoding techniques. Symbol $S_N$ is then Huffman encoded in accordance with the already-constructed modified Huffman tree (step 310). Thus, as will be appreciated by those skilled in the art, in this embodiment of the present invention the symbol set for arithmetic encoding and decoding purposes comprises only two symbols, $S_0$, and "not-$S_0$", the latter of which represents the information "not arithmetic encoded" which may be utilized by decoding system 200 to determine whether to decode the next symbol using Huffman decoding.

Thereafter, the next symbol $S_N$ to be encoded is received (step 307) and the above-described hybrid encoding method is repeated.

Hybrid Decoding

Figure 4:
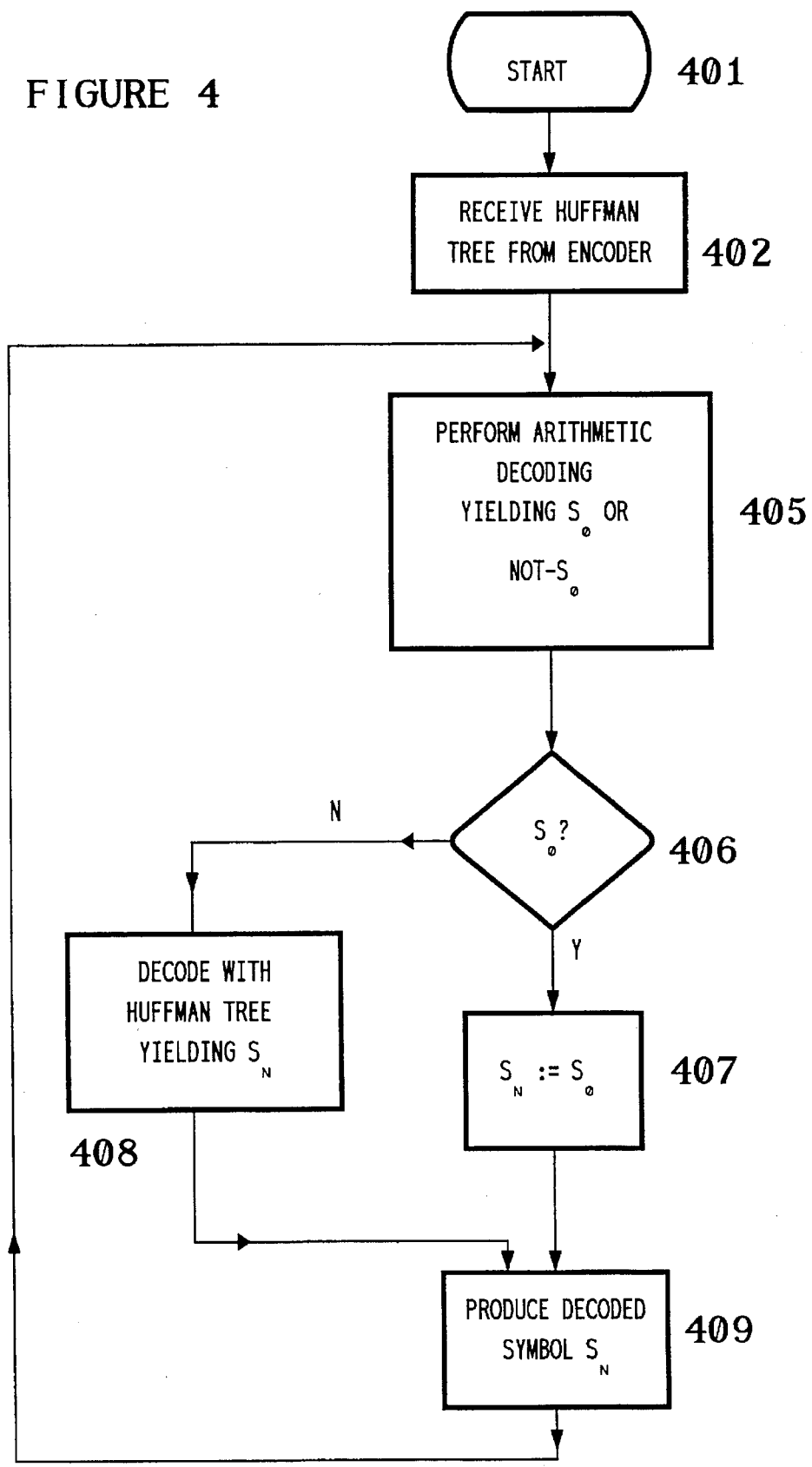
FIG. 4 is a flow chart of the method of decoding of the present invention.

Referring now to FIG. 4, there is shown a flow chart of the method of decoding of the present invention, which may be implemented on a decoding system such as decoding system 200 of FIG. 2. As illustrated in FIG. 4, the modified Huffman tree is received from an encoding system such as encoding system 100 (step 402 of FIG. 4) and stored appropriately in a memory, e.g. in tabular form. Alternatively, as will be understood by those skilled in the art and as described above with reference to FIG. 3, the modified Huffman tree to be utilized with the hybrid encoding and decoding of the present invention may be determined off line by a separate processor and stored, for example, within a ROM table in decoding system 200, and within a ROM table within encoding system 100 as well.

Once decoding system 200 already has the Huffman tree to be utilized for decoding purposes and begins to receive an encoded bitstream from encoding system 100, then decoding system 200 begins to decode symbols within the bitstream in the following manner. Decoding system 200 performs arithmetic decoding to yield either $S_0$ or Not-$S_0$ (step 405). If $S_0$ is the result of step 405 (step 406), then the symbol received was the most dominant symbol and has already been properly decoded with arithmetic decoding. If, however, Not-$S_0$ was produced, then the arithmetic decoded symbol represents the information "not arithmetic decoded", and the next symbol $S_N$ should be produced by decoding in accordance with Huffman decoding techniques (step 408). After the encoded symbol $S_N$ (which may represent either symbol $S_0$ which has been arithmetic decoded, or symbol $S_N \diamondsuit S_0$ which was Huffman decoded and which followed an arithmetic encoded symbol "not arithmetic decoded") is properly decoded, it is produced (step 409) for further processing such as for storage or display. Thereafter, the above-described hybrid decoding process is repeated.

Alternative Preferred Embodiments

In the above described preferred embodiment, a single dominant symbol $S_0$ is selected to be arithmetic encoded, with the remainder of S Huffman encoded. Because only one symbol is selected to be arithmetic encoded, the above described hybrid method may be referred to as Hy-1 encoding. In general, the first m most probable symbols $S_i$ of S, i.e., $S_0$, $S_i$, ... $S_{m-1}$, may be encoded with arithmetic encoding, and the remainder encoded with Huffman techniques. In this embodiment, each symbol $S_i$ of the symbols $S_0$ to $S_{m-1}$ has a probability $p_i$ such that $S_i$ is dominant in the set of symbols $\{S_i, S_{i+1}, \ldots, S_{n-1}\}$. However, for m>2, a point of diminishing returns may be reached very quickly. For example, even if $S_7$ is dominant with respect to $\{S_8, S_9, \ldots S_{n-1}\}$, $S_7$ may occur so rarely that it is not worthwhile to encode $S_7$ via arithmetic encoding. Therefore, in an alternative preferred embodiment of the present invention, termed "Hy-2", the first two most probable symbols $S_0$ and $S_1$, rather than solely $S_0$, are arithmetic encoded, while the remaining symbols of S are Huffman encoded.

Thus, as will be appreciated by those skilled in the art, in this embodiment of the present invention the symbol set for arithmetic encoding and decoding purposes comprises three symbols, $S_0$, $S_1$, and "neither $S_0$ nor $S_1$", the latter of which represents the information "not arithmetic encoded" which may be utilized by decoding system 200 to determine whether to decode the next symbol using Huffman decoding.

Table 1 below represents theoretical results for symbol sets S having varying probability distributions P, comparing the average number of bits per symbol in the encoded bitstream for pure Huffman encoding, Hy-1 encoding, Hy-2 encoding, and pure entropy encoding. Table 1 is constructed under the following assumptions. A symbol set S is approximately distributed in accordance with a geometric series of probabilities, of the form $p_i=(1-r)*r^i$, where $p_i$ is the probability of symbol $S_i$ of S. Results are shown in Table 1 for r=0.1, 0.3, 0.5, 0.7, and 0.9, corresponding to $p_0$=0.9, 0.7, 0.5, 0.3, and 0.1, respectively.

TABLE 1

| | | Number of Bits per Symbol | | | |
|---|---|---|---|---|---|
| $p_0$ | r | Huffman | Hy-1 | Hy-2 | Entropy |
| 0.9 | 0.1 | 1.111 | 0.580 | 0.527 | 0.521 |
| 0.7 | 0.3 | 1.429 | 1.310 | 1.274 | 1.259 |
| 0.5 | 0.5 | 2.000 | 2.000 | 2.000 | 2.000 |
| 0.3 | 0.7 | 2.961 | 2.954 | 2.949 | 2.938 |
| 0.1 | 0.9 | 4.725 | 4.722 | 4.718 | 4.690 |

As will be appreciated by those skilled in the art, for symbol sets S having less relatively dominant symbols (i.e. as $p_0$ decreases), the average number of bits per symbol in the encoded bitstream increases. However, other than for r=0.5, a special, anomalous case, entropy encoding always produces the best theoretical result, and pure Huffman encoding produces the least efficient result of the methods tabulated in Table 1. Methods Hy-1 and Hy-2 of the present invention, however, produce results close to that of pure entropy encoding, and produce much better results than pure Huffman encoding when one or more symbols are dominant (i.e., where $p_0$=0.9 or 0.7). For $p_0$=0.3 and 0.1, however, i.e. where no symbol is relatively dominant, then all four methods produce approximately similar results.

In alternative preferred embodiments, a symbol $S_i$ may be selected for arithmetic encoding as described hereinabove when $S_i$ is dominant with respect to subsequent symbols in the set S, yet a previous symbol such as $S_{i-1}$ is Huffman encoded because $S_{i-1}$ is not dominant with respect to the set $\{S_i, \ldots S_{n-1}\}$. For example, for a four-symbol set S=$\{S_0, S_1, S_2, S_3\}$, S may correspond to probability set P=$\{p_0, p_1, p_2, p_3\}$=$\{0.5, 0.49, 0.06, 0.04\}$. In this example, $S_0$ is not dominant in S, and can be efficiently encoded utilizing Huffman encoding techniques. However, $S_1$ is dominant in the set $\{S_1, S_2, S_3\}$, and therefore may be efficiently encoded utilizing arithmetic encoding as described hereinabove, with $S_2$ and $S_3$ encoded utilizing a second Huffman tree different from that used to encode $S_0$.

Those skilled in the art will appreciate that in alternative preferred embodiments other entropy encoding and decoding methods may be utilized instead of the arithmetic encoding and decoding utilized in the above-described embodiments. Similarly, in alternative preferred embodiments other VLC encoding and decoding methods may be utilized in alternative preferred embodiments instead of Huffman techniques.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A computer-implemented method for processing signals, the method comprising the steps of:
    (a) determining at least one dominant symbol of a set S comprising a plurality of symbols and forming a dominant set comprising the at least one dominant symbol;
    (b) receiving a next symbol for encoding;
    (c) determining whether the next symbol is in the dominant set; and
    (d) encoding the next symbol in accordance with either entropy encoding or variable-length encoding in accordance with the determination of step (c).

2. The method of claim 1, wherein step (a) comprises the step of determining that a symbol of the set S is dominant if the probability of the symbol is greater than a threshold probability.

3. The method of claim 2, wherein the probability threshold is 0.7.

4. The method of claim 1, wherein step (c) comprises the step of determining that a symbol of the set S is dominant if the probability of the symbol is much greater than the total probabilities of all symbols in the set S having a lower probability than the symbol.

5. The method of claim 1, further comprising the step of:
    (e) repeating steps (b) through (d) for a plurality of next symbols to be encoded.

6. The method of claim 1, further comprising the step of:
    (e) transmitting a bitstream representative of encoded symbols to a remote computer system.

7. The method of claim 1, wherein step (d) comprises the steps of:
    (1) encoding the next symbol in accordance with arithmetic encoding if the next symbol is in the dominant set; and
    (2) encoding the next symbol in accordance with Huffman encoding if the next symbol is not in the dominant set.

8. The method of claim 7, further comprising the step of:
    (e) generating a Huffman encoding tree in accordance with symbols in the set S that are not symbols in the dominant set.

9. The method of claim 1, further comprising the steps of:
    (e) transmitting a bitstream representative of encoded symbols to a remote computer system;
    (f) generating a Huffman encoding tree in accordance with symbols in the set S that are not symbols in the dominant set; and
    (g) repeating steps (b) through (e) for a plurality of next symbols to be encoded;
wherein:
    step (d) comprises the steps of:
        (1) encoding the next symbol in accordance with arithmetic encoding if the next symbol is in the dominant set; and
        (2) encoding the next symbol in accordance with Huffman encoding if the next symbol is not in the dominant set; and
    step (c) comprises the step of determining that a symbol of the set S is dominant if the probability of the symbol is much greater than the total probabilities of all symbols in the set S having a lower probability than the symbol.

10. An apparatus for processing signals, comprising:
    (a) means for determining at least one dominant symbol of a set S comprising a plurality of symbols and forming a dominant set comprising the at least one dominant symbol;
    (b) means for receiving a next symbol for encoding;
    (c) means for determining whether the next symbol is in the dominant set; and
    (d) means for encoding the next symbol in accordance with either entropy encoding or variable-length encoding in accordance with the determination of means (c).

11. The apparatus of claim 10, wherein means (a) comprises means for determining that a symbol of the set S is dominant if the probability of the symbol is greater than a threshold probability.

12. The apparatus of claim 11, wherein the probability threshold is 0.7.

13. The apparatus of claim 10, wherein means (c) comprises means for determining that a symbol of the set S is dominant if the probability of the symbol is much greater than the total probabilities of all symbols in the set S having a lower probability than the symbol.

14. The apparatus of claim 10, further comprising:
    (e) means for repeating the functions of means (b) through (d) for a plurality of next symbols to be encoded.

15. The apparatus of claim 10, further comprising:
    (e) means for transmitting a bitstream representative of encoded symbols to a remote computer system.

16. The apparatus of claim 10, wherein means (d) comprises:
    (1) means for encoding the next symbol in accordance with arithmetic encoding if the next symbol is in the dominant set; and
    (2) means for encoding the next symbol in accordance with Huffman encoding if the next symbol is not in the dominant set.

17. The apparatus of claim 16, further comprising:
    (e) means for generating a Huffman encoding tree in accordance with symbols in the set S that are not symbols in the dominant set.

18. The apparatus of claim 10, further comprising:
    (e) means for transmitting a bitstream representative of encoded symbols to a remote computer system;
    (f) means for generating a Huffman encoding tree in accordance with symbols in the set S that are not symbols in the dominant set; and
    (g) means for repeating the functions of means (b) through (e) for a plurality of next symbols to be encoded;
wherein:
    means (d) comprises:
        (1) means for encoding the next symbol in accordance with arithmetic encoding if the next symbol is in the dominant set; and
        (2) means for encoding the next symbol in accordance with Huffman encoding if the next symbol is not in the dominant set; and
    means (c) comprises means for determining that a symbol of the set S is dominant if the probability of the symbol is much greater than the total probabilities of all symbols in the set S having a lower probability than the symbol.

19. The apparatus of claim 18, wherein the apparatus is electrically connected to a bus and the bus is electrically connected to a memory device.

20. The apparatus of claim 10, wherein the apparatus is electrically connected to a bus and the bus is electrically connected to a memory device.

* * * * *

UNITED STATES PATENT AND TRADEMARK OFFICE
CERTIFICATE OF CORRECTION

PATENT NO. : 5,574,449
DATED : November 12, 1996
INVENTOR(S) : Stuart J. Golin

It is certified that error appears in the above-indentified patent and that said Letters Patent is hereby corrected as shown below:

Title page item [54], line 3,

Delete "ENCODIDNG", and insert therefor --ENCODING--.

Col. 1, line 3,

Delete "ENCODIDNG", and insert therefor --ENCODING--.

Signed and Sealed this

First Day of April, 1997

Attest:

BRUCE LEHMAN

*Attesting Officer*  *Commissioner of Patents and Trademarks*